(12) United States Patent
Wildes et al.

(10) Patent No.: US 6,651,197 B1
(45) Date of Patent: Nov. 18, 2003

(54) METHOD FOR DETERMINING THE OPTIMUM LOCATIONS FOR SCAN LATCHES IN A PARTIAL-SCAN IC BUILT IN SELF TEST SYSTEM

(75) Inventors: Paul T. Wildes, Eau Claire, WI (US); Edward J. O'Neill, Cadott, WI (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/315,904

(22) Filed: May 20, 1999

(51) Int. Cl.[7] .............................................. G01R 31/28
(52) U.S. Cl. ...................................................... 714/726
(58) Field of Search ........................................ 714/726

(56) References Cited

U.S. PATENT DOCUMENTS

| | | | |
|---|---|---|---|
| 4,357,703 A | | 11/1982 | Van Brunt .................... 371/15 |
| 4,974,184 A | * | 11/1990 | Avra .......................... 708/252 |
| 5,212,651 A | * | 5/1993 | Yabe ............................. 716/4 |
| 5,291,495 A | * | 3/1994 | Udell, Jr. .................... 714/726 |
| 5,319,647 A | * | 6/1994 | Hosokawa et al. ......... 714/726 |
| 5,661,733 A | * | 8/1997 | Schoessow ................. 714/726 |
| 5,717,700 A | * | 2/1998 | Crouch et al. .............. 714/726 |
| 5,949,692 A | * | 9/1999 | Beausang et al. ............ 716/18 |
| 6,141,790 A | * | 10/2000 | Beausang et al. ............. 716/5 |

OTHER PUBLICATIONS

Disclosure Title: LSSD Clock Insertion Method for Reducing Test Time Publication–Data: IBM Technical Disclosure Bulletin, Oct. 1984, US vol. No.: 27 Issue No.: 5 p. No.: 3158–3159 Publication–Date: Oct. 1, 1984 (19841001).*

M. Kishinevsky, A. Kondratyve, L. Lavagno, A. Saldanha and A. Taubin, "Partial scan delay fault testing of asynchronous circuits", 1997 IEEE/ACM International Conference on Computer–Aided Design Digest of Technical Papers, Page(s): 728–735.*

H.–J. Wunderlich and S. Hellebrand, "The pseudoexhaustive test of sequential circuits", Proceedings 1989 International Test Conference Meeting the Tests of Time, Page(s): 19–27.*

S. Bhatia and N.K. Jha, "Synthesis of sequential circuits for easy testability through performance–oriented parallel partial scan", Proceedings 1993 IEEE International Conference on Computer Design: VLSI in Computers and Processors, Page(s): 151–154.*

(List continued on next page.)

*Primary Examiner*—Albert Decady
*Assistant Examiner*—Joseph D. Torres
(74) *Attorney, Agent, or Firm*—Schwegman, Lundberg, Woessner & Kluth, P.A.

(57) ABSTRACT

A method for determining optimum locations for scan latches using traditional fault-simulation and some additional 'bookkeeping.' A logic simulation is run on the IC, with single stuck-at faults injected into the circuit. The entire test set is run and records are kept of which faults are detected at every latch in the system. After the simulation run, the statistics gathered are used to indicate which system latches are the best candidates for conversion to scan latches: A high count of faults indicates high observability at that point. This can be further refined by looking at total faults covered by given sets of latches. This permits maximizing fault coverage while minimizing resources. In addition, the software can keep a transition count at each latch's output, to enable the already established method of using transition counts to measure testability. A low transition count indicates a desirable place for a scan latch.

24 Claims, 6 Drawing Sheets

OTHER PUBLICATIONS

A.-L. Courbis and J.-F. Santucci; Pseudo–random behavioral ATPG; IEEE Proceedings Fifth Great Lakes Symposium on VLSI, Mar. 16–18, 1995, Page(s): 192–195.*

Sen–Chung Jiang, Chung Len Lee' Wen–Zen Shen, Chen, J.–E. and Ching–Ping Wu; LDS–ATPG: an automatic test pattern generation system for combinational VLSI circuits; IEEE Proceedings of Technical Papers from International Symposium on VLSI Technology, System.*

Chandra et al. (S.J. Chandra, T. Ferry, T. Gheewala and K. Pierce; ATPG based on a novel grid–addressable latch element; 28th ACM/IEEE Design Automation Conference; 1991; Page(s): 282–286.*

"IEEE Standard Test Access Port and Boundary–Scan Architecture", *The Institute of Electrical and Electronics Engineers, Inc.*, IEEE Std 1149.1–1990 (Includes IEEE Std 1149.1a–1993), Table of Contents, (Oct. 1993).

* cited by examiner

METHOD FOR DETERMINING THE OPTIMUM LOCATIONS FOR SCAN LATCHES IN A PARTIAL-SCAN IC BUILT IN SELF TEST SYSTEM

FIELD OF THE INVENTION

The present invention relates generally to an apparatus and method for testing logic on circuit chips. In particular, the present invention relates to fabrication of the test logic within the main logic of a chip for partial scan built in self test on a circuit chip.

BACKGROUND OF THE INVENTION

The present trend in integrated circuit design is toward higher levels of circuit integration, thereby reducing costs and improving circuit reliability. As IC technologies continue to develop, it is expected that circuits with at least 100,000,000 devices will become common.

Increased circuit integration is not, however, obtained without drawbacks. Increasing chip testing costs tend to reduce the benefits derived from more economically efficient design and production techniques. The costs associated with integrated circuit chip testing increase in proportion to the number of devices thereon. Much expense is incurred in the development of computer programs for running test routines. The engineering effort and computer time needed to devise these test routines can even exceed the requirements for designing the chip itself. It is not uncommon to employ as many engineers to develop tests for an IC to assure the quality of the part as the number of engineers designing a part. In addition, for particular types of circuits, circuit chip testing costs now account for roughly 10 to 40 percent of the total manufacturing costs.

A testing technique that is becoming, increasingly popular, is the built-in self-test technique. As its name implies, built-in self-test, or BIST, test systems are fabricated on the IC chip to be tested. BIST systems include a pattern or operand generator for producing test operands. Each test operand is applied to the IC logic, and the response thereto analyzed by means of a shift register. The response to thousands, and even millions, of test operands is then compressed into a "signature", which is compared to predetermined signatures for a go/no go indication of the IC's operation. One such BIST system is disclosed in the Van Brunt U.S. Pat. No. 4,357,703.

The BIST approach to circuit testing offers numerous advantages. BIST has minimal impact upon main logic functions since it is typically fabricated on the sparsely used peripheral areas of the integrated circuit chip. Since test results are processed by the BIST system, the number of tasks which must be performed by external test equipment is reduced. Specially developed maintenance software is therefore greatly reduced. Dynamic testing at full system clock rates significantly reduces system test times. BIST systems can also be used for testing integrated circuits at the wafer, chip, and system levels. Since they are independent of specific chip logic functions, BIST test systems can be used on any number of different types of circuit chips. The BIST approach also permits IC chips to be tested after they have been assembled into a computer, even though they are inaccessible to more traditional maintenance techniques. This will be the case, for example, when the IC is immersed in a liquid coolant to increase its performance.

Even though BIST test systems offer many advantages over alternative techniques, they have yet to be developed to their full potential. BIST testing systems have significant shortcomings when used in integrated circuits having 100,000 or more devices. BIST systems usually generate random numbers as test operands. The quality of many of the test operands, in terms of stressing the part, may be poor. When an integrated circuit has a high number of devices or transistors and as the operand goes deeper and deeper into the logic on the integrated circuit, the test becomes less and less effective. If there is a defect in the integrated circuit at a latch in the middle of the integrated circuit, there is a distinct possibility that the defect may go undetected. Certain areas of the integrated circuit may be untestable in that a defect may not propagate through many layers of logic and to an output pin to cause a test result indicating a defect. The result is that the integrated circuit may test "good" when in fact it is a part with a defect should be scrapped.

One means of alleviating this problem is to incorporate BIST scan circuitry into the inner layers of logic. This scan circuitry provides a means of both stimulating additional activity, and of capturing potentially failing signals that would otherwise be missed.

BIST scan is accomplished by substituting special 'scan latches ' for the standard latches contained in the functional logic. These scan latches function the same as a standard latch during normal system operation, but during BIST operations they can behave as both the operand generator and the signature analyzer described above.

In a 'full scan ' BIST design, every system latch is actually a scan latch. This provides maximum test coverage, and is simple to design, but uses a great deal of IC resources, and may be too expensive to implement. A popular alternative is 'partial scan, ' where only certain key latches get converted to scan latches, selected for maximum impact with the least cost.

Currently, a logic designer converts certain latches of a circuit to scan latches. The logic designer places the scan latches based on his or her experience. The placement of the scan latches is not based on any criteria other than the logic designer's knowledge. The problem is that even an experienced logic designer generally may be unable to place the scan latches so that a significant number of errors are detected. In other words, the scan latches may not be placed where the significant number of errors are detected. Currently, errors are detected and basically counted on a chip wide level.

As a result, there is need for a method and apparatus for determining which of the latches of a logic module should be converted into scan latches. In addition, there is a need for optimizing the placement of the scan latches so that a maximum number of errors can be detected. Furthermore, there is a need for a method and apparatus that does this automatically and one that can be used during simulation of a circuit design.

SUMMARY OF THE INVENTION

An integrated circuit apparatus includes main logic for performing digital logic operations. Also included on the integrated circuit apparatus is testing logic for performing dynamic tests of the main logic. This testing logic enables "Built-In Self Test," or BIST.

A simulation uses the pseudorandom number generator of the BIST circuitry to test the logic as designed and to convert certain of the latches in the logic to scan latches. The method optimizes the placement of the scan latches so that the maximum number of faults are detected by the scan latches. The system is used in a partial scan integrated circuit which uses a combination of traditional fault simulation and some additional bookkeeping. A logic simulation is run on the logic with single "stuck-at" faults injected into the circuit. While the test is being run, the number of faults detected are maintained in a table or record for every latch in the system. A separate list of faults detected at every scan latch is maintained. This simulation is like having full scan on the logic, based on the data collected and the statistics collected. Certain of the latches are turned into scan latches. For example, the latches having above a certain number of faults may be turned into scan latches, or the latches having any faults may be turned into scan latches. The result is that the particular latches that are turned into scan latches are optimized so that they can catch the most number of faults within the logic. Advantageously, a full scan is no longer necessary and a partial scan will detect most of the faults at the various latches. As a result, the selection of which latches to turn into scan latches is optimized so that it will result in finding the most faults that occur within the system. This minimizes the IC or logic resources needed for a successful test by using partial scan methodology. It also provides time and cost savings in the test insertion process and minimizes the required logic resources. A single pass of fault simulation yields statistical data on the entire design and can be used to optimally place the scan latches for a partial scan system.

This method is suited to be adapted to existing techniques, such as transition counting. Another criterion for converting a latch into a scan latch is the occurrence of a low transition count at a latch's output. During a simulation test, these low transition count latches can be determined. A low transition count indicates a point of poor controllability. A point of poor controllability is another criterion for converting a latch to a scan latch. This assures that more of the faults will be detected. Thus, the invention provides an apparatus and method that is adaptable and can be used to sensitize certain paths in logic so that faults that might otherwise go unnoticed are captured at output pins or at scan latches. An additional advantage of the testing method is that it also could do boundary scan type testing, much like the JTAG standard, found at IEEE/ANSI 1149.1-1990.

DETAILED DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
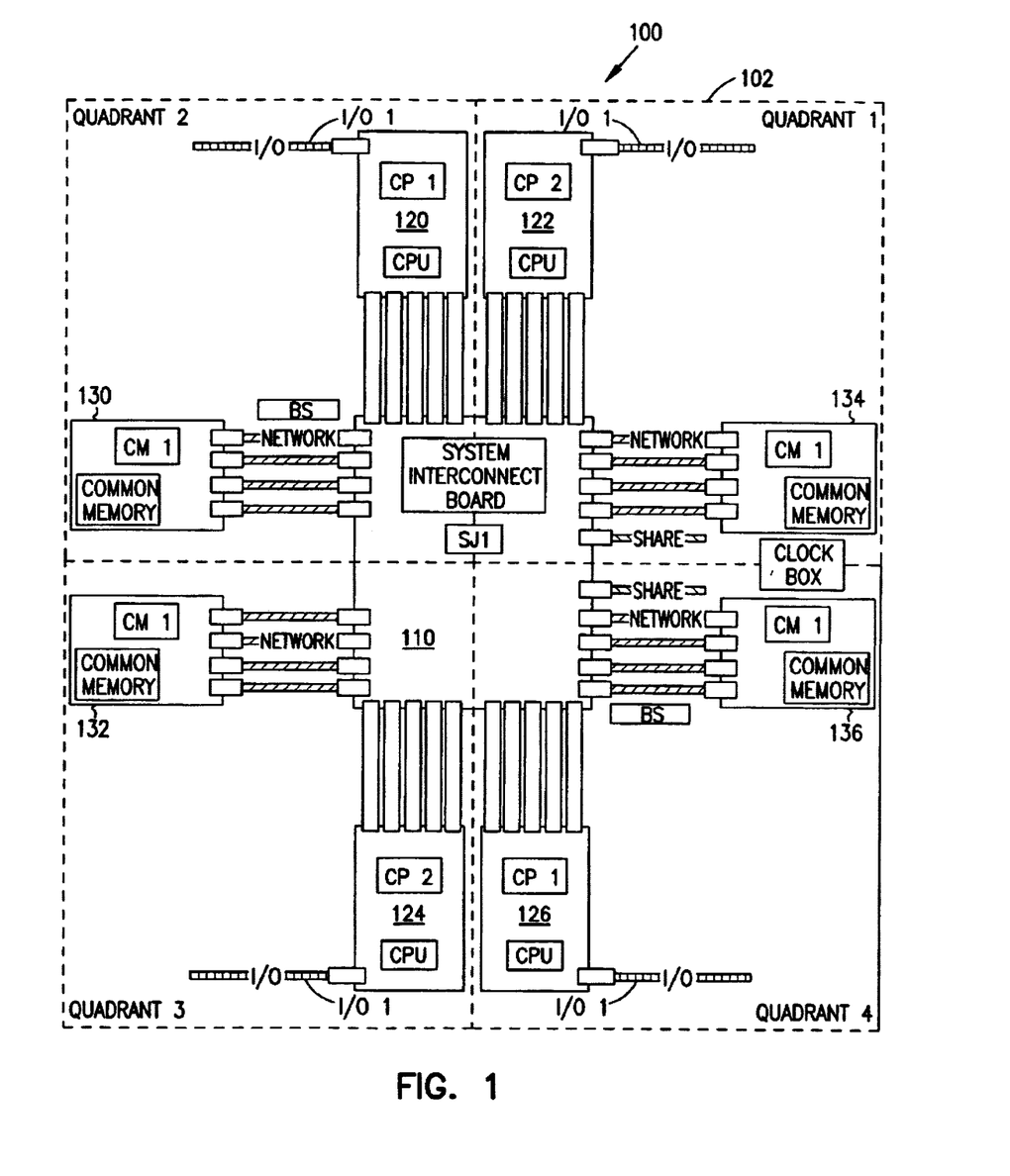
FIG. 1 is a schematic diagram of a supercomputer showing the large number of boards, which are populated with numerous modules which include integrated circuits contained in a supercomputer.

Referring to FIG. 1, a supercomputer 100 is shown. The supercomputer 100 includes a housing 102 which is depicted by dotted lines. The supercomputer includes a system interconnect board 110. CPU boards 120, 122, 124 and 126 are actual hardware printed circuit boards attached to the system interconnect board 110. Common memory boards 130, 132, 134, and 136 are also hardware printed circuit boards attached to the system interconnect board 110. Each of the CPU boards 120, 122, 124 and 126 shown in FIG. 1 is actually a stack of eight boards. As can be seen, there are many boards that must undergo testing. If any one of the boards is bad, the supercomputer 100 will not perform correctly. It is advantageous to have a self testing capability in the case of any computer and extremely advantageous in a supercomputer 100 since there are a large number of boards to test. If the testing had to be done by hand or hook up of external circuitry, testing a supercomputer would be cumbersome and nearly impossible. In addition, a supercomputer 100 also has a large number of boards 120, 122, 124, 126, 130, 132, 134, and 136 which require a relatively large amount of power to operate. Each of the boards 120, 122, 124, 126, 130, 132, 134, and 136 may include a number of integrated circuits. The boards and integrated circuits also include a multiplicity of logic modules. Since there are so many boards and logic modules involved, even a small savings of resources at the board or module level would be significant. It should be noted that the invention is well-suited for testing designed devices such as integrated circuit chips which are used for any purpose, as well as an electronic system including a central processing unit, a memory and a system bus shown in FIG. 6.

Figure 2:
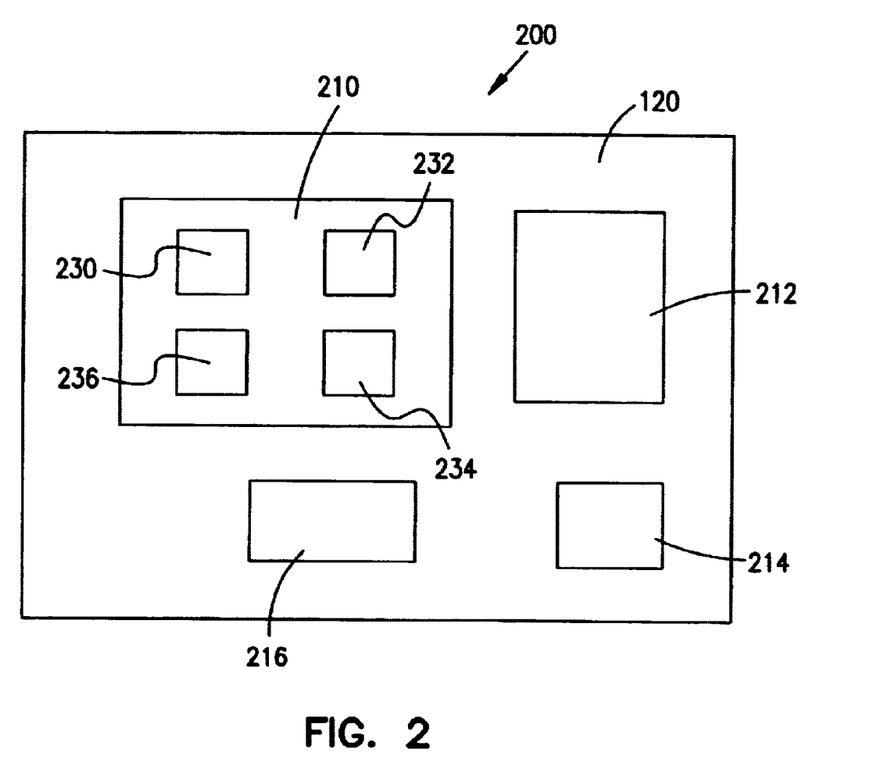
FIG. 2 is a schematic diagram of a module showing chips and logic blocks within the module.

FIG. 2 shows one hardware printed circuit board 200. The printed circuit board 200 includes chips 210, 212, 214, and 216. Each of the chips includes one or more logic blocks or logic modules. For all practical purposes, each chip includes a plurality of logic blocks or modules. In FIG. 2, chip 210 is the only one illustrated with logic blocks. Chip 210 includes logic blocks 230, 232, 234, and 236. The logic blocks, as implemented in hardware, include a plurality of gates and latches.

Figure 3:
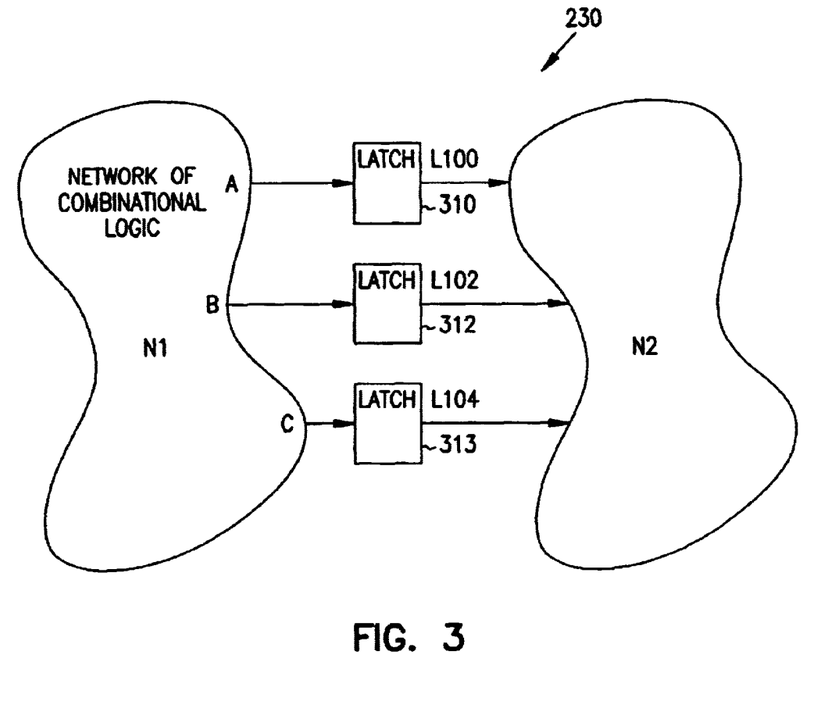
FIG. 3 is a block diagram showing basic logic associated with a chip.

FIG. 3 is a schematic diagram showing a portion of the logic associated with one logic block 230. The logic block 230 of FIG. 3 and the chip on which the logic block sits includes a plurality of regular latches (L100) 310, (L102) 312, and (L104) 314[, 316, 318, 320, 322, and 324]. The latches are used between each of the logic blocks, such as 230, to gate the data from one logic and a set of latches are used to gate the data before it goes into the next logic block. Signals pass through individual logic blocks at different rates and the latches can be thought of as providing a series of starting gates between logic blocks. Although only several latches are shown in FIG. 3, the main or core logic typically includes many logic blocks and hundreds or thousands of latches. In an integrated circuit, the latches hold signals that need to be released simultaneously. The logic also includes testing logic. Testing logic is used when a self test is performed on the particular board or the particular integrated circuit chip. Part of the self test function is to load test data into the main logic of the chip. The testing logic occupies a minor portion of the surface area of the integrated circuit chip. Scan latches are latches used for detecting errors in the processing data are detected.

Figure 4:
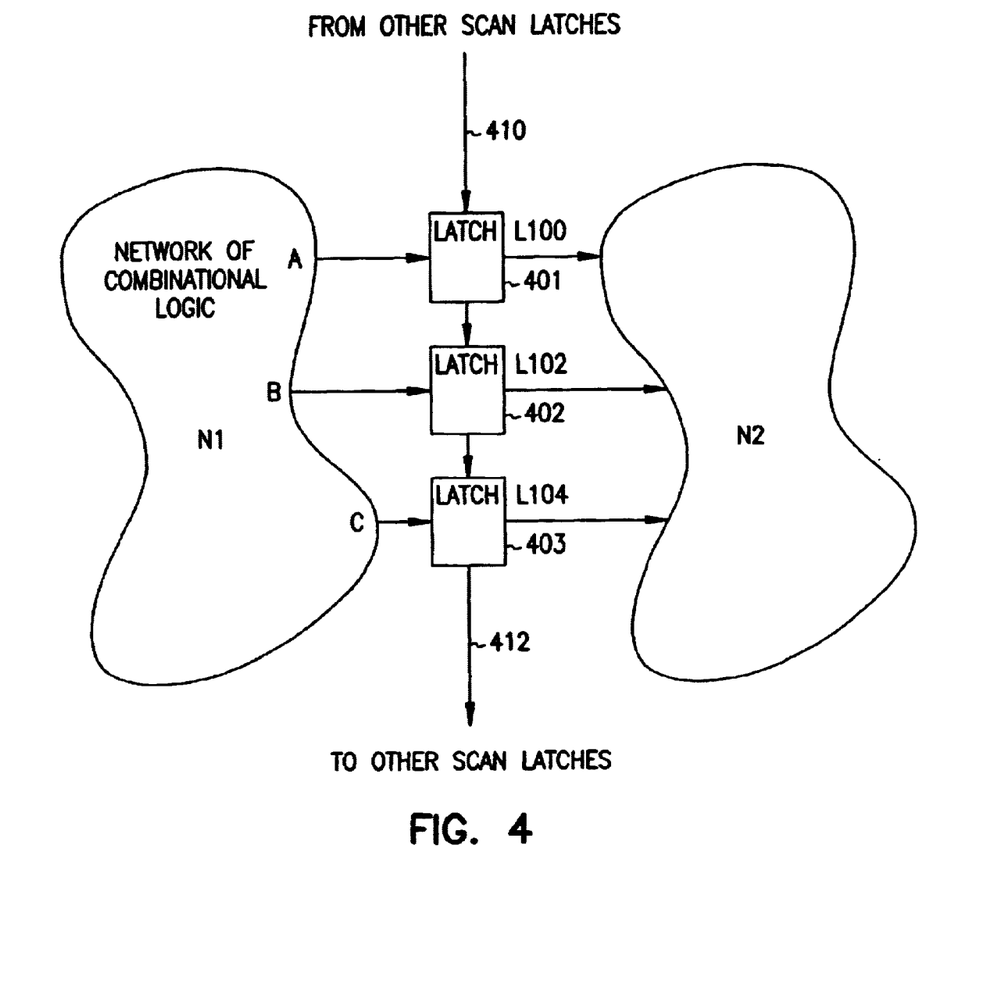
FIG. 4 is a block diagram showing basic logic which includes full scan BIST.

In actuality, the logic designer or logician designs logic modules of the chip using mathematical formulae which uses Boolean algebra. The actual physical layout is determined by software. In the past, a logic designer merely selected several latches to convert to scan latches. As shown in FIG. 4, several of the latches have been converted into scan latches. A scan latch input 410 is input to a first scan latch (L100) 401. The output from the first scan latch 401 is input to a second scan latch (L102) 402. The output from the second scan latch 402 is input to a third scan latch (L104) 403. The output from the last (in this case the third scan latch 403) or scan latch output 412 is the result of the scan test. Scan latch clock or clocks [416] (not shown) are added to each scan latch 401, 402, and 403, forming the scan latch chain. The scan latch input line 410 is used to initialize a self test and to inject test data frin testing logic. The scan latch output 412 can be used to detect errors.

The logic of an integrated circuit can be viewed as networks of combinational logic (logic gates) separated by some form of latches (clocked elements). See FIG. 3.

In a BIST scan design, the system latches are also connected in a series chain, called the scan chain. The latches showin in FIG. 4 are embedded within this scan chain. Since every system latch is also in the scan chain, this is termed 'full scan.'

Figure 5:
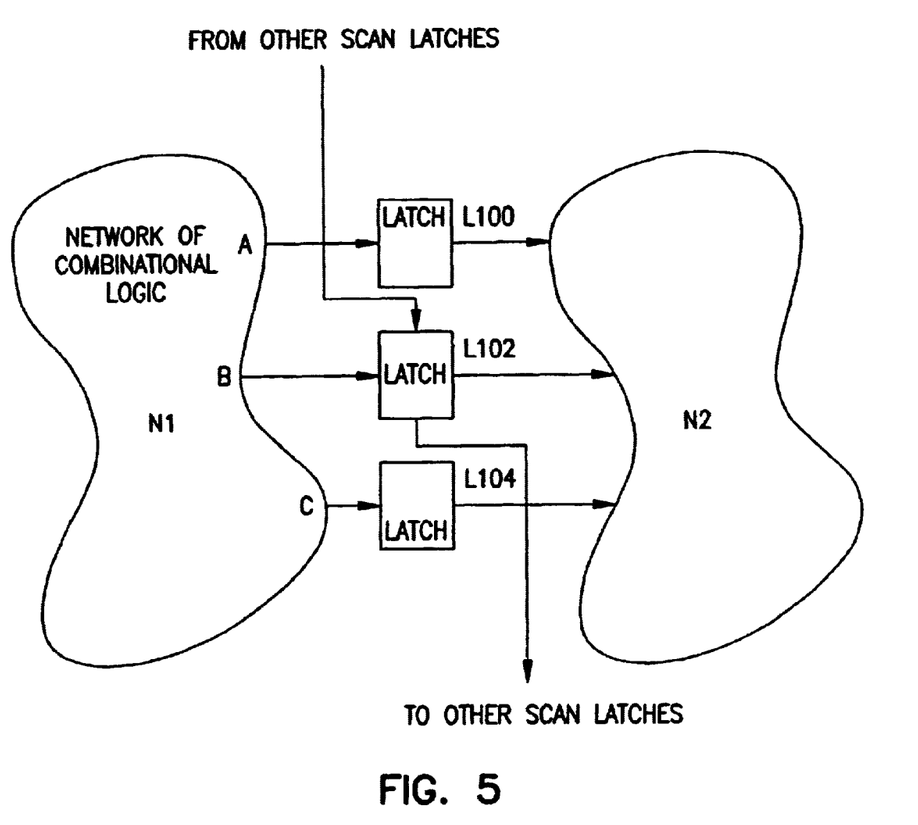
FIG. 5 is a flow diagram of a methodology for determining which of the latches in a logic design will be converted to scan latches.

There are a plurality of potential circuit faults within the combinational logic network N1. Supposing that the majority of all these potential circuit faults propagate out at point 'B,' it would be sufficient to include only latch L102 in the scan chain, as shown in FIG. 5. Thus, the majority of the faults will be detected at a reduced cost. The central purpose of this invention is a technique to appropriately select which latches to convert to scan latches in an automated and optimized fashion.

It should be understood that the self-test runs on a set of randomized numbers that are produced in successive clock cycles. In other words, the operand or test data in value is randomized during the self-test mode. Rather than add a random number generator to the chip 230, a pseudorandom generator is produced by inputting the test data in and the output of the test logic at a MUX. By inputting the output of the scan ring to the MUX[362] (not shown), a pseudorandomizer of data is generated and in addition any failure that is produced in the internal scan ring [360] is kept on the part throughout the test which can be thousands of clock cycles long. The output of the output test logic and the output of the internal scan ring are both input to another multiplexer or MUX to produce the test data output ("TDO"). The test data output is then checksummed to determine if the chip 230 and the main or core logic thereon is good.

Figure 6:
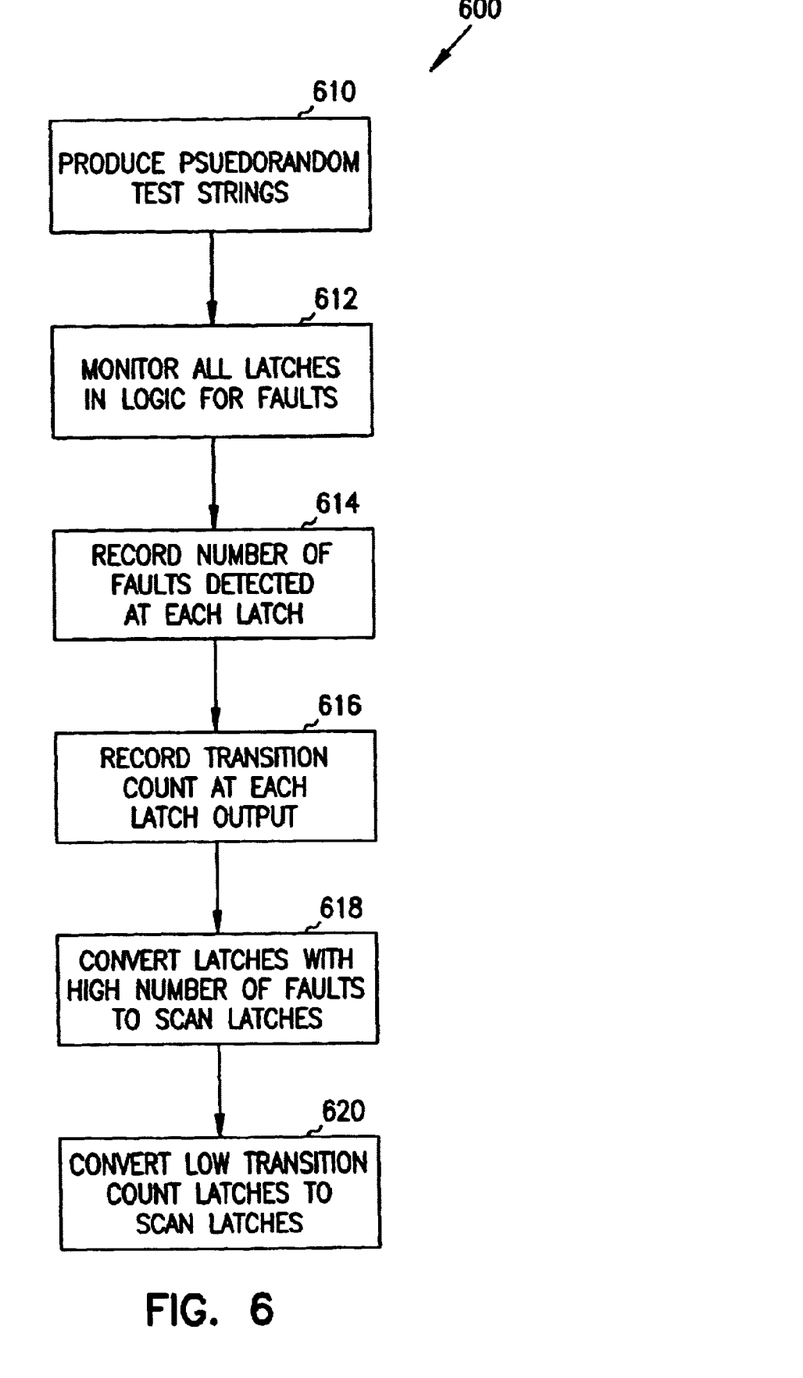
FIG. 6 is flow diagram of a process 600 for determining which of the latches of a logic design are converted to scan latches.

FIG. 6 shows a flow diagram of a process 600 for determining which of the latches of a logic design are converted to scan latches. The first step in the process 600 is to produce a pseudorandom test sequence, as depicted by step 610 in FIG. 6. As the pseudorandom test sequence passes through the logic, all the latches in the logic are monitored for faults, as depicted by step 612. The next step is to record the number of faults detected at each latch, as depicted by step 614. A table is kept in the memory of a computer system or information handling system. The table contains an identifier for each latch in the logic, as well as a list of errors detected at each particular latch. In other words, an accounting scheme detects the faults at each latch and keeps records of which faults are detected at every latch in the system. This is advantageous since the method allows the entire test to run to completion, such as in normal pseudorandom testing in a normal BIST system. The end result is the IC or logic is treated as if it had a full scan and a list of all the faults detected at every scan latch is kept.

In addition to keeping a list of detected faults, the software also can keep a transition count at each of the latch's output, as depicted by step 616 in the process 600. The end result is that using a single pass of fault simulation yields statistical data on the entire design for determining optimum location for scan latches. This statistical data can be used in many different ways to set a threshold or test for converting a regular latch into a scan latch. The table containing the data within the memory of the computer system is consulted for the number of detected faults for each latch, as well as the number of transition counts occurring at each latch. The computer can then use the table to determine the latches that have more than a threshold number of detected faults. These latches are then converted to scan latches. Another way to set a threshold is to look at the number of detected faults in total and determine the number of latches necessary to cover a certain percentage of all faults that occur as a result of the simulation test with pseudorandom generated data. Still another way to determine which latches will be turned into scan latches is to determine the total number of scan latches that the logic design will allow. The latches are then ranked in terms of number of faults and the latches having the highest number of faults are then converted to scan latches. As one can see, there are many different ways to set thresholds to determine which of the latches in the logic design to convert to scan latches.

A transition count is also kept for each of the latches. A transition count is an indication of the amount of activity at a particular latch. Latches are typically placed where there is a low or lower transition count when compared to the other latches in the logic design. The low transition count indicates a low amount of activity. Scan latches are typically placed at these areas since an error may go undetected at these low-activity latches. Another reason is that the placement of a scan latch assures at least a minimum amount of activity with the latch. The step of converting the latches with a high number of faults into scan latches is shown by reference numeral 618 in FIG. 6. The final step is to convert low-transition-count latches to scan latches, as depicted by step 620 in FIG. 6. It should be pointed out that these two criterion can be separate in a particular design of logic. For example, scan latches could be used only where there is a high number of faults in a particular logic design.

The advantage of the process 600 for determining where to place latches is that the latches are placed as a result of objective measures for evaluating which latch to turn into a scan latch. The method also provides a time and cost savings in the process of converting latches into scan latches. The process takes place as part of the simulation test and therefore saves time from the standpoint of not requiring a logician to go in and insert scan latches. The above method also optimizes this process, therefore optimizing the placement of the scan latch so that either the most faults will be detected or the areas of low transition count are also converted from regular latches to scan latches.

Advantageously, the invention includes a method and apparatus for converting one or more latches in a logic design to a scan latch. A simulation uses the pseudorandom number generator of the BIST to test the logic as designed, and converts certain of the latches in the logic to scan latches. The method optimizes the placement of the scan latches so that the maximum number of faults are detected by the scan latches. The system is used in a partial scan integrated circuit which uses a combination of traditional fault simulation and some additional bookkeeping. A logic simulation is run on the logic with single stuck-at faults injected into the circuit. While the test is being run, the number of faults detected are maintained in a table or record for every latch in the system. A list of all faults detected at every scan latch is maintained. This simulation is like having full scan on the logic, based on the data collected and the statistics collected. Certain of the latches are turned into scan latches. For example, the latches having above a certain number of faults may be turned into scan latches, or the latches having any faults may be turned into scan latches. The result is that the particular latches that are turned into scan latches are optimized so that they can catch the most number of faults within the logic. Advantageously, a full scan is no longer necessary and a partial scan will detect most of the faults at the various latches. As a result, the selection of which latches to turn into scan latches is optimized so that it will result in finding the most faults that occur within the system. This minimizes the IC or logic resources needed for a successful test by using partial scan methodology. It also provides time and cost savings in the test insertion process and minimizes the required logic resources. A single pass of fault simulation yields statistical data on the entire design and can be used to optimally place the scan latches for a partial scan system.

Another method or another criterion for converting a latch into a scan latch is the occurrence of a low transition count at a latch's output. During a simulation test, these low transition count latches can be determined. A low transition count indicates a point of poor control ability. A point of poor control ability is another criterion for converting a latch to a scan latch. This assures that more of the faults will be detected. Thus, the invention provides an apparatus and method that is adaptable and can be used to sensitize certain paths in logic so that faults that might otherwise go unnoticed are captured at output pins or at scan latches. An additional advantage of the testing method is that it can also could do boundary scan type testing, much like the JTAG standard, found at IEEE/ANSI 1149.1-1990.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A method for placing scan latches in a logic chip, said method comprising:
    monitoring a plurality of latches for faults;
    monitoring the plurality of latches for transitions;
    recording the number of transitions detected at each of the plurality of latches; and
    recording the number of faults detected at each of the plurality of latches.

2. The method of claim 1 further comprising:
    determining the latches in the logic chip that have the most number of detected faults associated therewith; and
    converting the latches in the logic chip that have the most number of detected faults to scan latches.

3. The method of claim 2 wherein the converting of the latches in the logic chip that have the most number of detected faults to scan latches includes:
    setting a threshold value for the number of detected faults; and
    selecting the latches having more than the threshold value for the number of detected faults to convert to scan latches.

4. A computer readable medium having computer-executable instructions for performing the method of claim 3.

5. The method of claim 2 wherein the step of converting the latches in the logic chip that have the most number of detected faults to scan latches includes:
    setting a threshold value for the percentage of detected faults with respect to total number of faults; and
    ranking the latches in terms of number of faults;
    selecting the latches with the highest number of faults and converting them to scan latches until the threshold value for the percentage of detected faults with respect to total number of faults is met.

6. A computer readable medium having computer-executable instructions for performing the method of claim 5.

7. A computer readable medium having computer-executable instructions for performing the method of claim 2.

8. The method of claim 2 wherein the step of converting the latches in the logic chip that have the most number of detected faults to scan latches includes:
    setting a threshold value for the number of scan latches for the logic chip; and
    ranking the latches in terms of number of faults;
    selecting the latches with the highest number of faults and converting them to scan latches until the threshold value for the number of scan latches is met.

9. A computer readable medium having computer-executable instructions for performing the method of claim 8.

10. The method of claim 1 further comprising the steps of:
    determining the latches in the logic chip that have the lowest number of transition counts associated therewith; and
    converting the latches in the logic chip that have the lowest number of transition counts to scan latches.

11. A computer readable medium having computer-executable instructions for performing the method of claim 10.

12. A computer-readable medium having computer-executable instructions for performing the method of claim 1.

13. An apparatus for simulating designed logic comprising:
    means for monitoring a plurality of latches for events;
    means for monitoring the plurality of latches for transitions;
    means for recording the number of transitions detected at each of the plurality of latches; and
    means for recording the number of events detected at each of a plurality of latches.

14. The apparatus of claim 13 further comprising means for converting selected latches in the logic design to scan latches in response to the number of events recorded for each of the plurality of latches.

15. The apparatus of claim 13, further comprising:
    means for determining the latches in the logic chip that have the lowest number of transition counts associated therewith; and
    means for converting the latches in the logic chip that have the lowest number of transition counts to scan latches.

16. The apparatus of claim 13, further comprising:
    means for setting a threshold value for the number of detected faults; and means for selecting the latches having more than the threshold value for the number of detected faults to convert to scan latches.

17. A method for placing scan latches in a logic chip, said method comprising:

monitoring a plurality of latches in the logic chip for faults that are detected at each of the plurality of latches;

recording the number of faults detected at each of the plurality of latches;

monitoring the plurality of latches for transitions;

recording the number of transitions detected at each of the plurality of latches;

based on the recorded number of transitions detected, converting a first subset of the plurality of latched to scan latches; and based on the recorded number of faults detected at each of the plurality of latches, converting a second subset of the plurality of latches to scan latches.

18. The method of claim 17, further comprising:

determining which of the plurality of latches that have more than a threshold number of detected faults associated therewith; and wherein the converting the subset of the plurality of latches to scan latches is based on whether the threshold number is met.

19. The method of claim 17, further comprising:

ranking the plurality of latches based on the number of detected faults associated therewith; and wherein the converting the subset of the plurality of latches to scan latches is based on the ranking.

20. The method of claim 17 further comprising:

determining a number of detected faults in total;

determining a number of latches necessary to cover a predetermined percentage of the total detected faults that occur as a result of a simulation test with pseudo-random generated data; and wherein the converting the subset of the plurality of latches to scan latches is based on the number of latches necessary to cover the predetermined percentage of the total detected faults.

21. The method of claim 17, further comprising:

determining a total number of scan latches that the logic chip will allow;

ranking the plurality of latches based on the number of detected faults associated therewith; and wherein the converting is based on the ranking and the total number of scan latches that the logic chip will allow.

22. A computer-readable information medium having control information thereon for causing a suitably programmed system to perform the method of claim 17.

23. A logic chip comprising:

combinatorial logic;

a plurality of latches operatively coupled to the logic in the logic chip, wherein a first subset and a second subset of the plurality of latches also function as scan latches, and wherein a number of faults detected by the first subset of the plurality of latches that also function as scan latches exceeds a number of faults detected by a plurality of latches that do not also function as scan latches, and wherein transition counts by the second subset of the plurality of latches that also function as scan latches are fewer than transition counts by a plurality of latches that do not also function as scan latches.

24. The logic chip of claim 23, wherein the plurality of latches also function as scan latches each detect more than a threshold number of detected faults; and wherein the plurality of latches that do not also function as scan latches each detect the threshold number or fewer faults.

* * * * *

UNITED STATES PATENT AND TRADEMARK OFFICE
CERTIFICATE OF CORRECTION

PATENT NO. : 6,651,197 B1
DATED : November 18, 2003
INVENTOR(S) : Wildes et al.

It is certified that error appears in the above-identified patent and that said Letters Patent is hereby corrected as shown below:

Title page,
Item [56], References Cited, OTHER PUBLICATIONS, delete "Kondratyve" and insert -- Kosratyev --, therefor.

Column 4,
Line 48, delete "[, 316,318, 320, 322 and 324]" after "314".

Column 5,
Line 10, delete "[416]" after "clocks".
Line 14, delete "frin" and insert -- from --; therefor.
Line 40, delete "[362]" after "MUX".
Line 42, delete "[360]" after "ring".

Column 8,
Lines 1, 14, 17, 29 and 38, delete "computer readable" and
insert -- computer-readable --, therefor.

Column 9,
Lines 23 and 28, delete "the" after "wherein".

Column 10,
Line 1, delete "the" after "wherein".

Signed and Sealed this

Thirteenth Day of July, 2004

JON W. DUDAS
*Acting Director of the United States Patent and Trademark Office*